United States Patent [19]

Iida

[11] Patent Number: 5,793,219
[45] Date of Patent: Aug. 11, 1998

[54] TESTING OF SEMICONDUCTOR INTEGRATED CIRCUITS

[75] Inventor: Shunichi Iida, Hamamatsu, Japan

[73] Assignee: Yamaha Corporation, Hamamatsu, Japan

[21] Appl. No.: 691,173

[22] Filed: Aug. 1, 1996

[30] Foreign Application Priority Data

Aug. 2, 1995 [JP] Japan .................................. 7-197810

[51] Int. Cl.$^6$ .................................................. G01R 31/02
[52] U.S. Cl. ................................................................ 324/757
[58] Field of Search ................................ 324/758, 72.5, 324/757, 754–769; 438/14–18

[56] References Cited

U.S. PATENT DOCUMENTS 4,994,735   2/1991   Leedy ...................................... 324/755

Primary Examiner—Ernest F. Karlsen
Assistant Examiner—Anh Phung
Attorney, Agent, or Firm—Pillsbury Madison & Sutro LLP

[57] ABSTRACT

A semiconductor integrated circuit is tested such that probe styli are brought into contact with electrodes on integrated circuit chips formed in a semiconductor wafer to test circuit characteristics of the integrated circuit chips. A test is conducted over a given number of integrated circuit chips. A fraction defective over the given number of integrated circuit chips is calculated as a result of the test conducted. Probe pressure with which the probe styli contact the electrodes on the integrated circuit chips is controlled on the basis of the calculated fraction defective.

5 Claims, 10 Drawing Sheets

TESTING OF SEMICONDUCTOR INTEGRATED CIRCUITS

BACKGROUND OF THE INVENTION

1. Field of the Invention

The present invention relates to testing of semiconductor integrated circuits, and more particularly to a method of testing semiconductor integrated circuits, and a testing apparatus and a wafer prober which are used in implementing the method.

2. Prior Art

Testing of LSI's (large scale integrated circuits) is classified into a wafer level test (hereafter referred to as "the probe test") which is carried out just after the manufacture of a wafer, and an assembly level test (hereafter referred to as "the product test") which is carried out just after the assembly.

In both the probe test and the product test, an LSI tester is used to measure/determine electrical characteristics of an internal circuit, but an apparatus which is connected to the LSI tester varies depending on whether the object to be tested is chips formed in a wafer (in the probe test) or packaged products (in the product test). A wafer prober is connected in the probe test while a handler is connected in the product test. That is, the LSI tester serves the measurement/determination of electrical characteristics of objects to be tested while the wafer prober and the handler serve making a connection between test pins of the LSI tester and input/output terminals of objects to be tested, thus serving different purposes.

A probe test is employed to prevent defective products from being fed to an assembly step. By discerning defective products from non-defective products at an early stage, a test efficiency in the product test can be enhanced and the part cost can be reduced. This test is essential inasmuch as some chips are sold or used as they are before being assembled.

Referring to FIGS. 9 to 14, an example of the probe test will be described. As illustrated in FIG. 9, a wafer 1 is comprised of a multiplicity of IC chips 2 which are arranged in an array consisting of rows and columns. Each chip 2 is formed of an electronic circuit including transistors, metal wiring patterns, etc. As shown in FIG. 10, each chip 2 is formed with electrode pads 3 along its periphery which serve as input/output terminals of the electronic circuit.

The purpose of the probe test is to conduct a test of circuit characteristics of IC chips 2, which are arranged in a regular array on the wafer, by sequentially shifting chips in a manner illustrated in FIG. 11. To conduct such probe test, the use of a means is required which connects individual chips 2 on the wafer, which are the object to be tested, to the LSI tester in a sequential manner, and this function is served by the wafer prober.

FIGS. 12 and 13 illustrate the construction of a conventional wafer prober 10, FIG. 12 being a plan view of the wafer prober 10 as viewed from the top and FIG. 13 being a front view of the same. Referring to these figures, the wafer 1 is placed on a wafer support base 11, which is provided with a vacuum chuck mechanism, not shown, for fixing the wafer 1 thereon by applying suction thereto. The wafer support base 11 is driven for transitional movement along X-axis, Y-axis and Z-axis (which is in the vertical direction) by actuators, not shown, and is also driven for rotational movement about a shaft 11a. A probe card 12 is fixedly mounted on the body of the wafer prober by a socket 13. Substantially at the center of the probe card 12, a plurality of probe styli 14 project downward in an oblique direction. Each probe stylus 14 is electrically connected at its base end to the LSI tester through a wiring, not shown, which is provided on the probe card 12, and one of cables 15. The location of the distal end of each probe styli 14 is aligned with the center position of each of the electrode pads 3 on the IC chip 2 (see FIG. 10). A marker 20 marks any chip 2 which is determined to be defective during the probe test, with ink, a laser beam or the like, such operation being referred to as the marking operation.

The probe test is carried out by repeating operations illustrated in FIGS. 14A to 14D after an initial setting of the position of the wafer support base 11 such that the individual electrode pads 3 on the IC chip 2 of the wafer 1 are correctly located directly below the respective probe styli 14. More specifically, the wafer support base 11 is lifted through a predetermined stroke from a position illustrated in FIG. 14A to a position shown in FIG. 14B. As a result, the individual electrode pads 3 on the IC chip 2 of the wafer 1 are brought into abutment against the distal ends of the respective probe styli 14. In this manner, the electrode pads 3 on the IC chip 2 are connected to the LSI tester, not shown, through the probe styli 14. A test of characteristics of the IC chip 2 as an electronic circuit takes place under this condition. If the LSI tester determines a particular chip to be defective, the marker 20 effects a marking of this chip. Upon completion of testing the chip 2, the wafer support base 11 is lowered as indicated in FIG. 14C, whereby the wafer 1 moves away from the probe styli 14. Subsequently, the wafer support base 11 is shifted through a stroke which is equivalent to the size of a single chip, as shown in FIG. 14D. Thus a chip 2, which is located next to the particular chip which has just undergone the probe test, has its electrode pads 3 positioned immediately below the probe styli 14. A procedure as described above is applied to this chip, and subsequently the same procedure is repeated for all the remaining chips on the wafer 2.

In the probe test described above, it is necessary that probe pressure, with which the probe styli are brought into contact with the electrode pads on the IC chips, should be controlled to an optimum value. This is because if the probe pressure is too strong, it may cause destruction of the electronic circuit in the IC chip. If the probe pressure is too weak, the contact resistance increases to cause an apparent change in any electric characteristic of the electronic circuit contained in the IC chip, causing an erroneous determination that the tested chip is defective even when its electronic circuit has no problem whatsoever, exerting a great influence upon the yield. In particular, and when the IC chip, which is the object to be tested, is a circuit having delicate analog characteristics such as an operational amplifier, analog/digital or digital/analog converter or other analog circuits, contact resistance between the probe styli and the electrode pads on the IC chip may cause distortion in the waveform of an input signal actually applied to the electronic circuit of the chip or an output signal therefrom or cause differences in the delay time of such signals, which again has a great influence upon the results of the test.

The probe pressure referred to above is a repellent force which the probe styli are subject to from the electrode pads, and has a magnitude which depends on the resilience of the probe styli themselves and the amount of overdrive when the electrode pads abut against the probe styli (namely, a distance by which the electrode pad moves toward the probe card beyond the position where it just contacts the probe stylus). Accordingly, in the wafer prober as illustrated in FIGS. 12 and 13, for example, the probe pressure can be adjusted by adjusting a distance between the wafer support base and the probe card when the base is lifted.

However, it is to be noted that such an adjustment of the probe pressure is not of a nature that once an optimum value of probe pressure is reached, all that is required is to maintain such value, but that the adjustment must be conducted for every probe test for the following reason.

First of all, since the size of the IC chips which are the object to be tested, the number of electrode pads on the individual chip and the disposition of electrode pads vary with the type of the IC chips, a variety of probe cards must be used separately depending on the type of IC chips which are subjected to the probe test. Then it is also to be noted that such probe cards exhibit inherent physical responses, and accordingly the requirement to achieve an optimum condition of contact between the probe styli and the electrode pads on the IC chip generally vary with the type of the IC chips. Accordingly, whenever the type of the IC chips which are to be tested is changed or each time a probe card used is changed, an adjustment of the probe pressure is required.

Further, the distal ends of the probe styli on the probe card should ideally be located on a common plane. However, it is unavoidable that variation occurs in the level of the distal ends of the styli due to a variation involved with the manufacturing process, however precisely the manufacture takes place. As a consequence, what is mentioned above remains the same if a probe card corresponding to IC chips of the same type is employed.

Additionally, an aging factor must be considered. Specifically, when a number of IC chips are tested, the distal ends of the probe styli become abraded, causing a change in the contact resistance. This requires an adjustment of the probe pressure as the contact resistance of the distal ends of the styli changes in order to avoid yield degradation.

In these circumstances, the prior art practice has been to adjust the probe pressure for every probe test. Because no means has been available which permits a convenient adjustment of the probe pressure to an optimum value, a troublesome operation is required in that a trace of probe imprinted on the electrode pad as the probe stylus is brought into contact therewith is recognized by a microscope to determine the magnitude of probe pressure, and the probe pressure is adjusted depending upon the determined magnitude (e.g., adjustment of the overdrive amount in a wafer prober as shown in FIGS. 12 and 13). A greatest possible value of probe pressure is then selected within such a range that can avoid damage to the electronic circuit of the IC chip, and the probe test is conducted while maintaining the probe pressure fixed at the selected value, which is normally in a range from 5 to 20 grange.

As mentioned above, the conventional practice of the probe test involved a troublesome operation of adjusting the probe pressure, and has therefore been inefficient. Because of the difficulty of adjusting the probe pressure as described above, the success of the adjustment largely depends on the skill of the operator; and if the adjustment is unsuccessful, a degradation in the yield results.

SUMMARY OF THE INVENTION

It is therefore an object of the invention to provide a method of testing semiconductor integrated circuits which allows the probe pressure to be adjusted to an optimum value without an increased burden on the operator and yield degradation in the yield which is attributable to improper probe pressure, and a testing apparatus and a wafer prober which are used in implementing the method.

To attain the above object, according to a first aspect of the invention, there is provided a method of testing semiconductor integrated circuits, in which probe styli are brought into contact with electrodes on integrated circuit chips formed in a semiconductor wafer to test circuit characteristics of the integrated circuit chips, comprising the steps of a) conducting a test of a given number of the integrated circuit chips, b) calculating a fraction defective over the given number of the integrated circuit chips as a result of the test, and c) controlling probe pressure with which the probe styli contact the electrodes on the integrated circuit chips, on a basis of the calculated fraction defective.

In a preferred embodiment of the invention, the method comprises the steps of a) sequentially setting probe pressure with which the probe styli contact the electrodes on the integrated circuit chips, to a plurality of different values, b) conducting a test of a given number of the integrated circuit chips at each of the plurality of different values of probe pressure whenever the probe pressure is set to the each of the plurality of different values, c) calculating a fraction defective over the given number of the integrated circuit chips as a result of the test, and d) selecting a value of probe pressure which exhibited a minimum value of fraction defective as the calculated defraction defective, from among the plurality of different values of probe pressure.

In another preferred embodiment of the invention, the method comprises the steps of a) sequentially conducting a test of each of a given number of the integrated circuit chips and calculating a fraction defective over the given number of the integrated circuit chips as a result of the test, b) changing probe pressure with which the probe styli contact the electrodes on the integrated circuit chips, to a different value from a value applied in the test conducted in the step a) whenever the calculated fraction defective exceeds a predetermined value, c) conducting a test of the given number of the integrated circuit chips at the different value of probe pressure whenever the probe pressure is changed to the values, d) calculating the fraction defective over the given number of the integrated circuit chips as a result of the test conducted at the different value of probe pressure, and e) selecting a value of probe pressure which exhibited a minimum value of fraction defective as the detraction defective calculated at the step d), from among a plurality of different values of probe pressure applied in the test conducted in the step c).

In still another preferred embodiment of the invention, the method comprises the steps of a) sequentially conducting a test of each of a given number of the integrated circuit chips and calculating a fraction defective over the given number of the integrated circuit chips as a result of the test, b) changing probe pressure with which the probe styli contact the electrodes on the integrated circuit chips, on a basis of at least one change in the fraction defective calculated at the step a) previously conducted at least one time, in a manner such that a direction in which the probe pressure is to be changed is maintained when the fraction defective currently calculated at the step a) shows a drop relative to a value previously calculated at the step a), while the direction is reversed from a direction exhibited by the change in the fraction defective calculated at the step a) previously conducted when the fraction defective currently calculated at the step a) shows an increase relative to the value previously calculated at the step a), and c) alternately repeating the steps a) and b).

To attain the object, according to a second aspect of the invention, there is provided a testing apparatus for use in a test of semiconductor integrated circuits in which probe styli are brought into contact with electrodes on integrated circuit chips formed in a semiconductor wafer to test circuit characteristics of the integrated circuit chips, comprising a device that creates information which is used for controlling probe pressure with which the probe styli contact the electrodes on the integrated circuit chips on a basis of a fraction defective determined as a result of the test of the integrated circuit chips, and a device that transmits the information to a device that adjusts the probe pressure.

To attain the object, according to a third object of the invention, there is provided a wafer prober for bringing probe styli into contact with electrodes on integrated circuit chips formed in a semiconductor wafer, comprising a device that receives information which is used for controlling probe pressure with which the probe styli contact the electrodes on the integrated circuit chips, and a device that adjusts the probe pressure in accordance with the information.

According to another preferred embodiment, the wafer prober comprises a device that creates information which is used for controlling probe pressure with which the probe styli contact the electrodes on the integrated circuit chips on a basis of results of a test of the integrated circuit chips and a fraction defective determined as a result of the test, and a device that adjusts the probe pressure in accordance with the information.

The above and other objects, features, advantages of the invention will be more apparent from the following detailed description taken in conjunction with the accompanying drawings.

DETAILED DESCRIPTION

The invention will now be described in detail with reference to the drawings showing embodiments thereof.

Several embodiments of the invention will now be described in order to facilitate an understanding of the present invention. However, it should be understood that these embodiments are exemplary, and are not intended to limit the invention thereto, but that a number of changes, modifications and variations thereto are possible within the scope of the invention.

Figure 1:
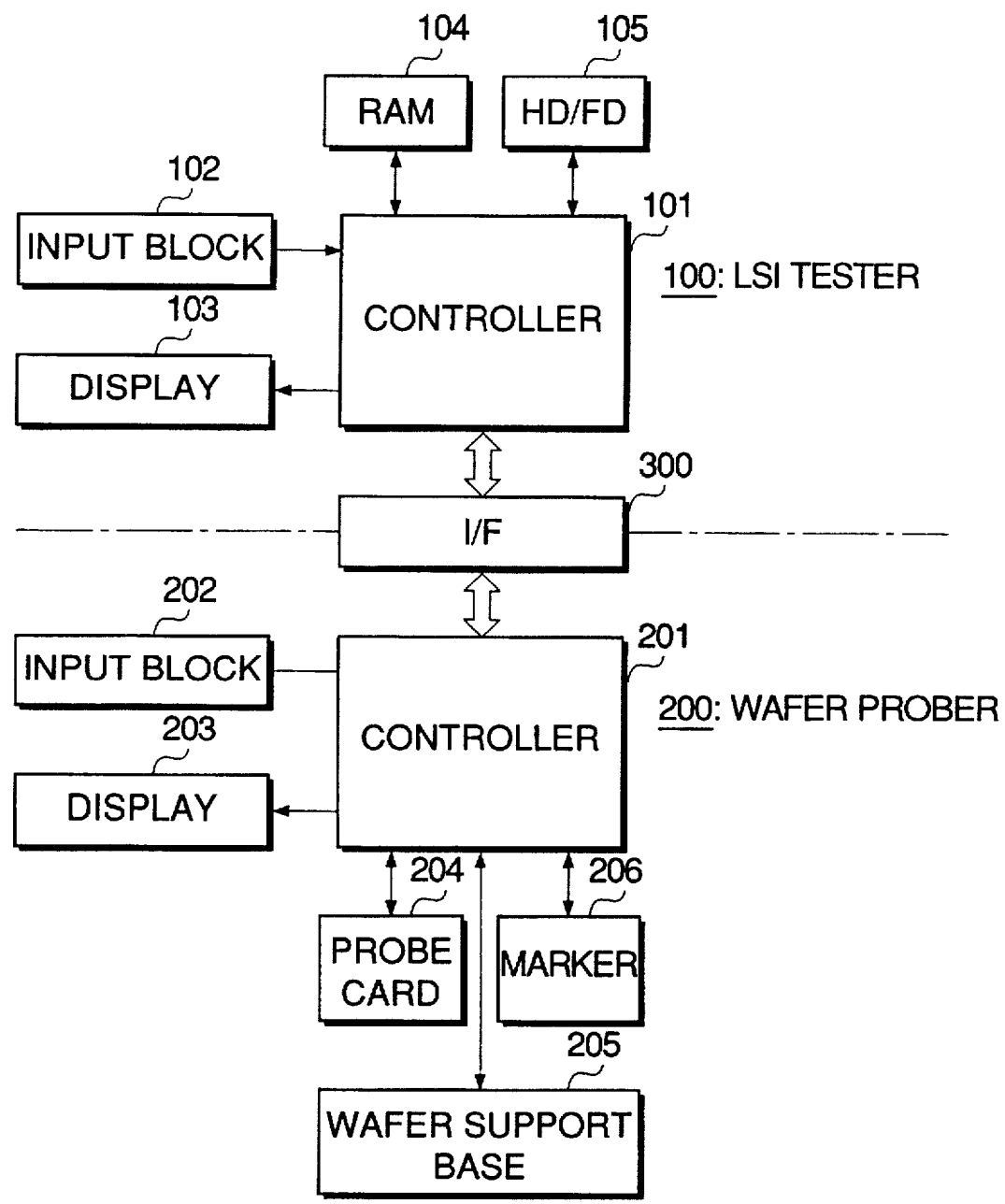
FIG. 1 is a block diagram of the arrangement of a testing system which is used in implementing a testing method according to the invention.

FIG. 1 shows the arrangement of a testing system which is used in implementing the testing method of the invention. In the figure, an LSI tester 100 is connected to a wafer prober 200 through an interface 300.

The LSI tester 100 is comprised of a controller 101, an input unit 102 which may be formed by a keyboard or the like, a display 103 such as a CRT display, a RAM 104, and an auxiliary memory 105 which may be formed by a hard disk (HD), a flexible disk (FD) or the like.

The input unit 102 is used as means for inputting various commands such as a command to start a test to the controller 101 by an operator. The display 103 displays response messages or the like to such commands. The auxiliary memory 105 stores measurement programs and test patterns corresponding to various IC's which are to be tested. During a test in response to a command applied by an operator, a measurement program and a test pattern which are to be used in the test are read and transferred to the RAM 104.

The measurement program is an assembly of commands which defines a specific procedure for determining whether an IC being tested is non-defective or defective. An IC is required to satisfy various requirements such as a given logical function and a loaded driving capability, and a decision which determines each IC to be non-defective or defective is rendered by successively executing a series of tests which determine whether or not these requirements are satisfied. The measurement program is comprised of a series of commands which are required for the execution of such tests. A test pattern is comprised of a time sequence of patterns which defines input waveforms to be applied to an IC being tested and response waveforms which are expected to be obtained from a normal IC in response to the input waveforms, and are principally used in the test of a logical function of an IC.

The controller 101 sequentially reads out a series of commands which constitutes the measurement program stored within the RAM 104, and controls the application of supply voltage to an IC, the supply of a test pattern, a measurement of an output current or the like, thus sequentially executing various tests during an IC test. During the probe test, these tests are conducted through the use of the wafer prober 200, and the supply of voltage or a test pattern to an IC chip being tested takes place through the interface 300.

In addition to the control over the execution of these tests during the probe test, the controller 101 normally monitors or determines a fraction defective or percent defective during the test, and performs its control operation so as to optimize the probe pressure on the basis of the determined fraction defective. It is to be noted that the determined fraction defective is a percentage of a number of IC chips which have been determined to be defective as the result of the test with respect to a total number of IC chips which have been subjected to the test. The control of the probe pressure on the basis of the determined fraction defective constitutes the gist of the invention.

Figure 12:
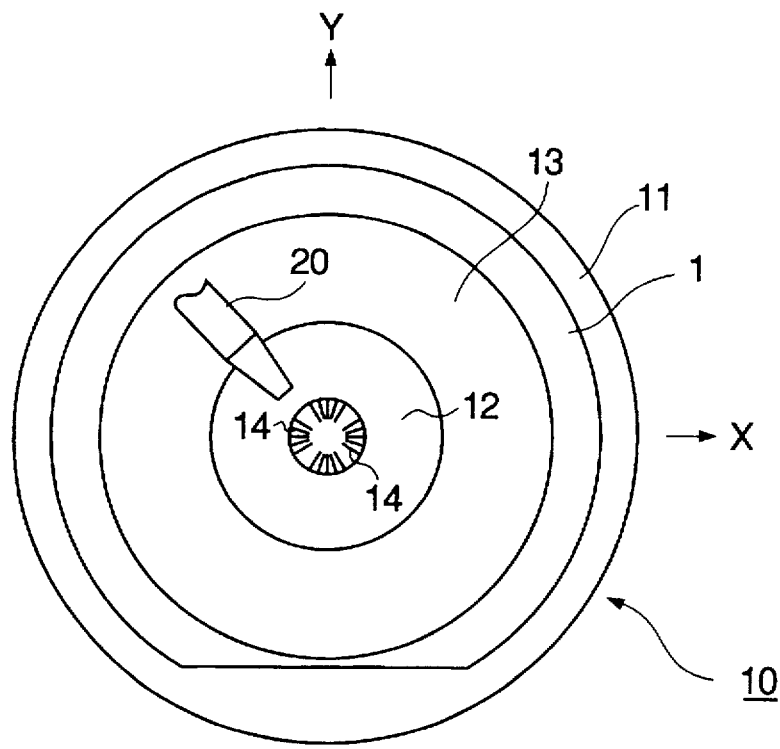
FIG. 12 is a plan view of a wafer prober.
Figure 13:
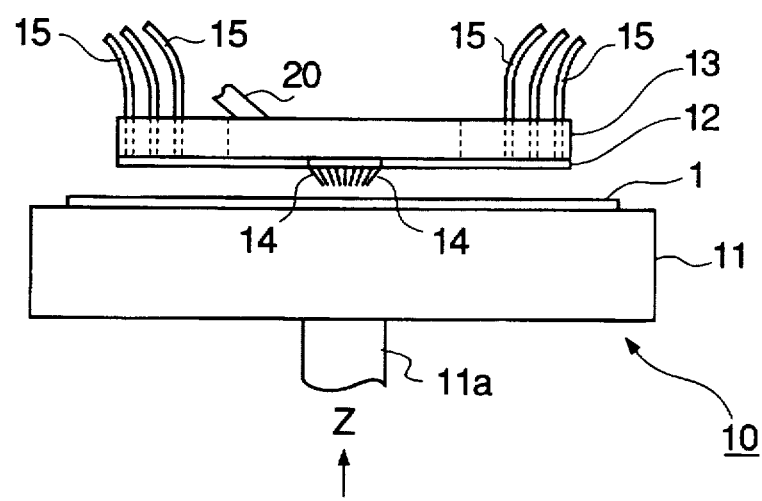
FIG. 13 is a front view of the wafer prober.
Figure 14A:
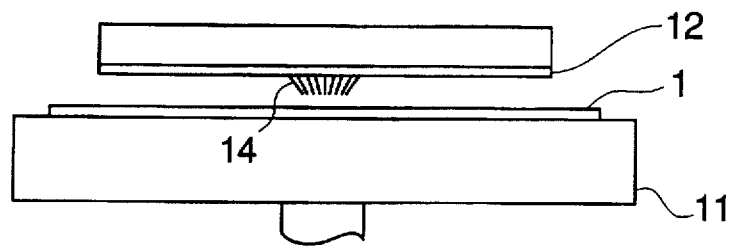
FIGS. 14A to 14D are a series of schematic views, illustrating the operation of the wafer prober during successive steps of the probe test.
Figure 14B:
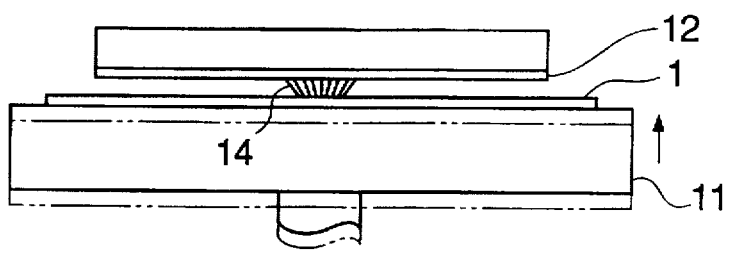
Figure 14C:
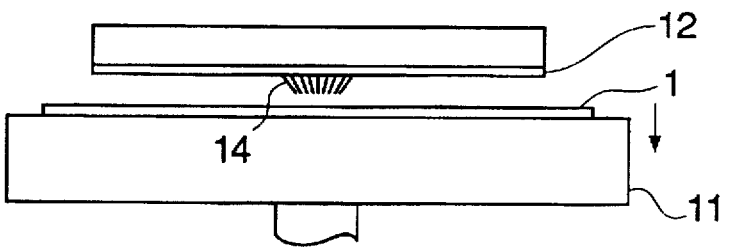
Figure 14D:
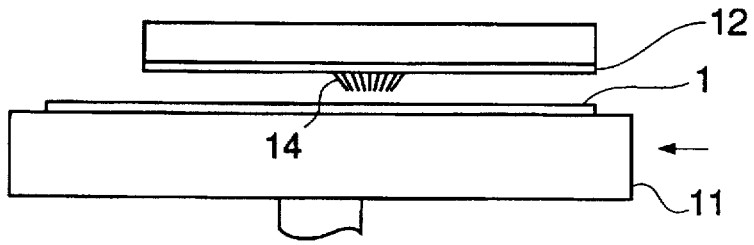

On the other hand, the wafer prober 200 is comprised of a controller 201 which controls various parts of the prober, an input block 202 which is used to input commands, a display 203 for displaying response messages from the controller 201, a probe card 204, a wafer support base 205, and a marker 206. The probe card 204, the wafer support base 205 and the marker 206 are constructed and function in the same manner basically as described previously in connection with FIGS. 12 and 13. However, it is to be noted that the wafer prober 200 is provided with means which controls the probe pressure. Specifically, during the probe test, a command which is used in controlling the probe pressure is fed from the controller 101 of the LSI tester 100 to the controller 201 through the interface 300. The elevation or level of the wafer support base 205 as it is lifted is controlled by the controller 201, thereby controlling the probe pressure.

Several embodiments of the testing method which are carried out by using the testing system shown in FIG. 1 will now be described.

Figure 2:
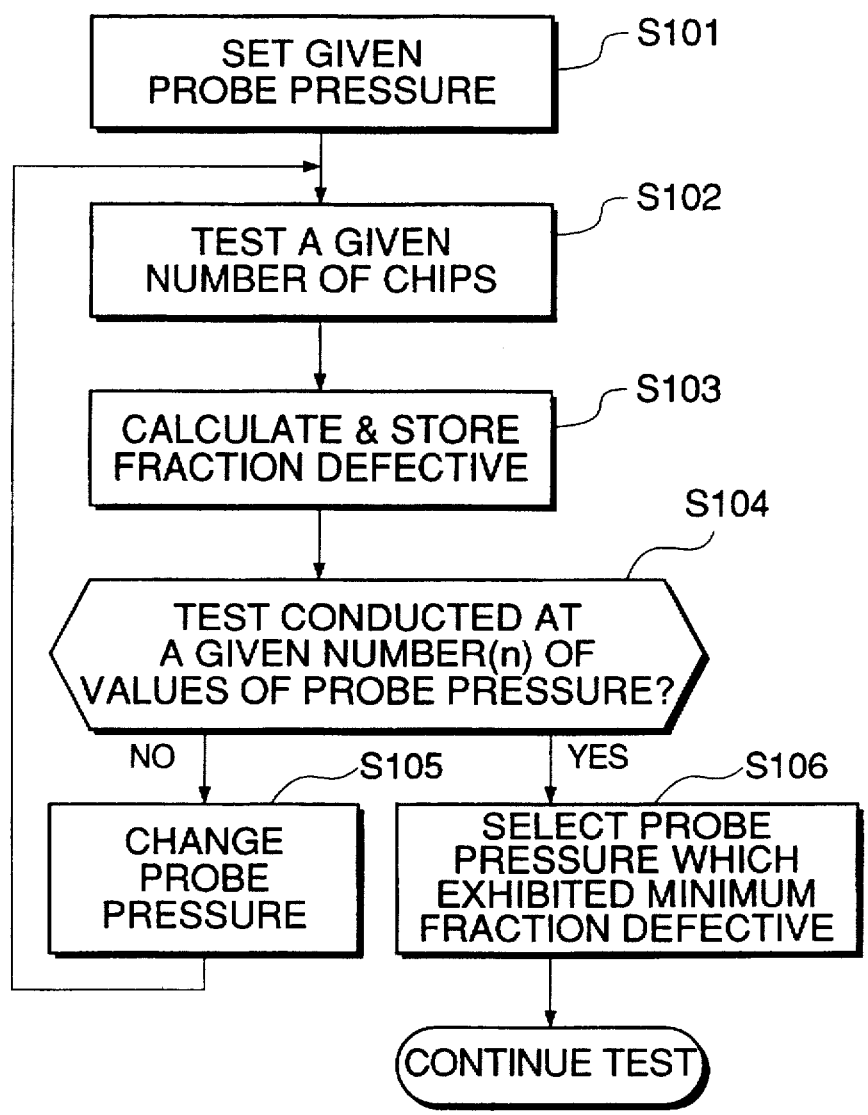
FIG. 2 is a flowchart of a testing method according to a first embodiment of the invention.

FIG. 2 is a flowchart of a testing method according to a first embodiment of the invention. Prior to the commencement of the probe test, an initialization of the probe pressure is carried out (step S101). Specifically, a command requesting that the probe pressure be initialized is fed from the controller 101 of the LSI tester 100 to the controller 201 of the wafer prober 200 through the interface 300. In response thereto, an adjustment is made such that a given elevation of the wafer support base 205 is established as it is lifted so that a given value of probe pressure is established when the base 205 is lifted to achieve a contact between the electrode pads on the IC chip and the probe styli.

Figure 3:
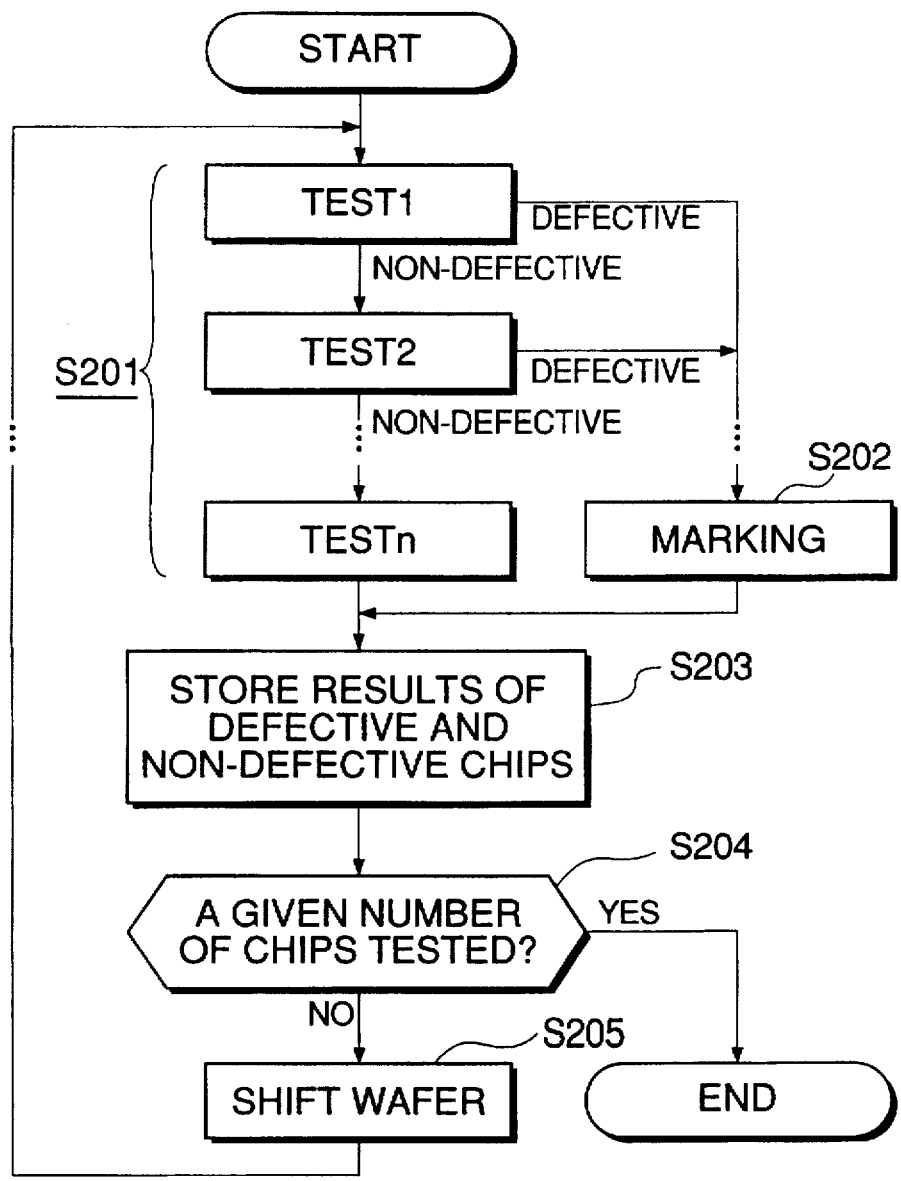
FIG. 3 is a flowchart of a portion of the flowchart of FIG. 2, which relates to a characteristic test of an IC chip in the embodiment shown in FIG. 2.

Upon completion of the initialization of the probe pressure, the probe test is commenced, executing tests on a given number of IC chips (step S102). More specifically, tests as illustrated in FIG. 3 are executed on a given number of IC chips.

Initially, a command requesting commencement of the test is transmitted from the controller 101 to the controller 201. In response thereto, the wafer support base 205 is lifted, and the electrode pads on an IC chip to be tested are brought into contact with the probe styli of the probe card 204. A series of commands which constitutes the measurement program stored in the RAM 104 is successively read out by the controller 201, sequentially executing a test 1 to a test n in accordance with these commands (all these tests take place in step S201). The test 1 to test n are total items of the probe test which are required to determine whether any IC chip is non-defective or defective.

During the time the probe test is being performed, supply voltage, applied voltage, and a test pattern or the like which are required in carrying out the test are supplied to an IC chip being tested through a path including the controller 101, the interface 300, the controller 201, the probe styli of the probe card 204 and the electrode pads on the IC chip. A response from the IC chip is passed through the same path conversely to reach the controller 101 of the LSI tester 100 to be used in determining whether or not the IC chip tested is non-defective. When a defective IC chip is found in one of test 1 to test n, a command requesting that the marking be applied is fed from the controller 101 to the controller 201, which causes the marker 206 to mark to the associated IC chip (step S202). If a defective IC chip is not found over the entire tests, these chips are determined to be non-defective. Upon completion of the series of tests, a command requesting termination of the test is transmitted from the controller 101 to the controller 201. In response thereto, the wafer support base 205 is lowered, allowing the electrode pads on the IC chip to move away from the probe styli of the probe card 204.

Then, the result of the tests is stored in the RAM 104 (step S203). Specifically, if the result of a test indicates that the chip is non-defective, a variable representing a number of non-defective chips which is stored in the RAM 104 is incremented by 1. On the other hand, when a defective chip is found, a variable representing a number of defective chips is incremented by 1. A determination is then made as to whether the probe test has been applied to all of the given number of IC chips (step S204). If the probe test is incomplete, a command requesting movement of the wafer is transmitted from the controller 101 to the controller 201 (step S205). In response thereto, the support base 205 is moved through a stroke corresponding to the size of one IC chip, and an IC chip which is located next to the IC chip which has just been subjected to the probe test is positioned directly below the probe styli of the probe card 204. Thereafter, the above procedure is repeated over the remaining IC chips. When the probe test over the given number of IC chips is completed, the process then returns to the routine shown in FIG. 2.

The controller 101 then reads the variable representing the number of non-defective IC chips and the variable representing the number of defective IC chips from the RAM 104, and determines the fraction defective by calculating the percentage of the number of defective IC chips relative to the number of IC chips, which is the given number mentioned above, subjected to the probe test, and the fraction defective is stored in the RAM 104 (step S103). A determination is then made as to whether the probe test has been conducted at an n (which is the given number) number of values of probe pressure (step S104). If the result of the determination is "NO", a command to change the probe pressure, such as a command to increase the probe pressure by one increment, for example, is fed from the controller 101 to the controller 201. A desired elevation value which is to be reached when the wafer support base 205 is lifted is then changed in accordance with this command under the control of the controller 201. The process then returns to step S102.

Thereafter, the probe pressure is changed to another value (step S105). For each value of probe pressure, the above-described procedure is repeated, and a determined fraction defective for each value of probe pressure is sequentially stored in the RAM 104 (step S103). When the probe test at the n number of values of probe pressure has been completed, the process exits from the "YES" path of the step S104, proceeding to step S106 wherein a value of probe pressure which produced the minimum value of the determined fraction defective among those stored in the RAM 104 is determined and is selected. A command indicating the selected value of probe pressure, which may be an ordinal number of the minimum value of probe pressure in a line of the n number of values of probe pressure, is transmitted from the controller 101 to the controller 201. Consequently, the desired elevation value which is to be attained when the wafer support base 205 is lifted is selected to the elevation value corresponding to the particular probe pressure which produced the minimum value of the determined fraction defective. Thereafter, the probe pressure which is optimized in this manner is used to conduct probe test over all the remaining IC chips.

Figure 4:
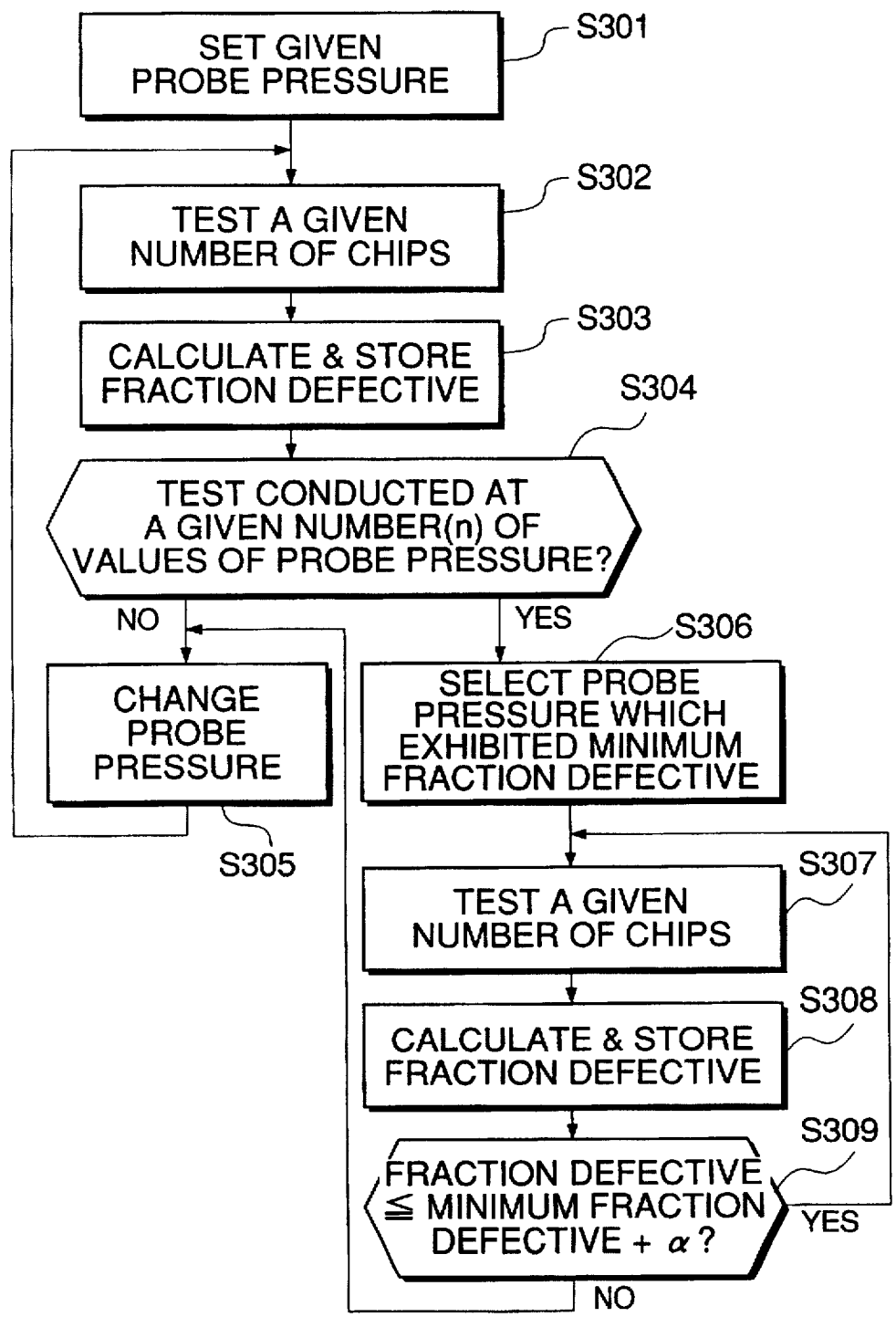
FIG. 4 is a flowchart of a testing method according to a second embodiment of the invention.

FIG. 4 is a flowchart of a testing method according to a second embodiment of the invention. In the first embodiment described above, an optimum value of probe pressure is determined only at the commencement of the probe test, and subsequently the probe pressure is fixed at the optimum value to conduct the probe test. In the second embodiment described below, the manner of determining an optimum value of probe pressure is the same as in the first embodiment, and steps S301 to S306 shown in the flowchart of FIG. 4 remain unchanged from corresponding steps S101 to S106 (FIG. 2) described above in connection with the first embodiment.

However, in the second embodiment, a tendency of the fraction defective which is detected during the probe test continues to be monitored after an optimum value of probe pressure has been determined. In the event that the determined fraction defective is degraded, an optimization of the probe pressure is tried again, and this is what is added in the second embodiment. Thus the probe test proceeds through a series of steps including conducting a test over a given number of IC chips (step S307) after an optimum value of probe pressure has been obtained at the step S306, calculating a fraction defective as a result of this test and storing it in the RAM 104 (step S308), and examining whether the present fraction defective lies within a preset value a from a past record of the minimum determined value of fraction defective (step S309).

If a decision rendered at the step S309 is "NO", indicating that there is an inadmissible rise in the determined fraction defective, the process returns to the step S305, wherein an optimization of the probe pressure is carried out in the same manner as the manner described above in connection with the first embodiment. In this manner, an optimization of the probe pressure takes place not only at the commencement of the probe test, but also whenever a degradation in the determined fraction defective is found. This is effective when the probe test lasts over a long time period.

Figure 5:
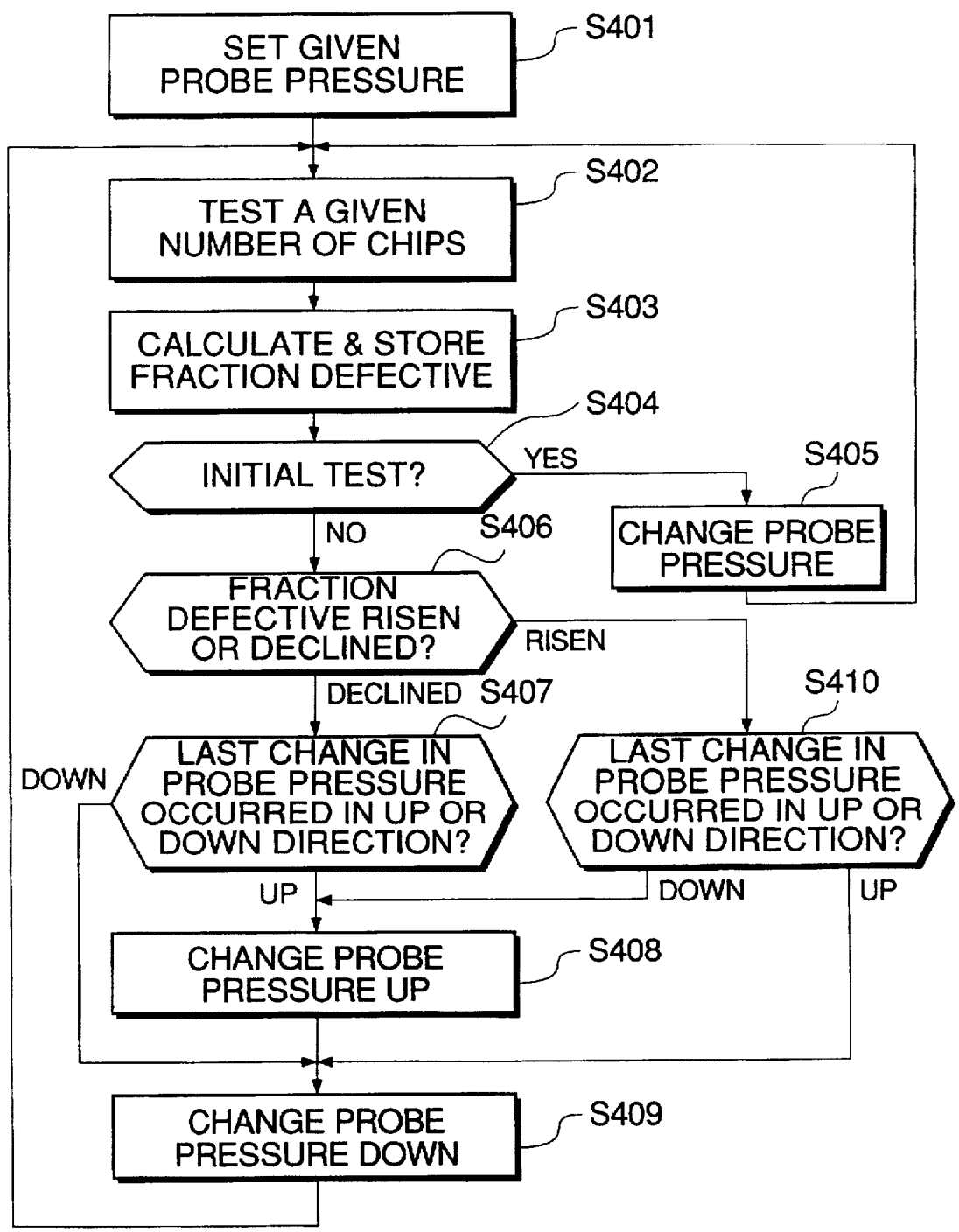
FIG. 5 is a flowchart of a testing method invention.

FIG. 5 is a flowchart of a testing method according to a third embodiment of the invention. In the first and second embodiments described above, an optimum value of probe pressure has been determined by obtaining values of fraction defective at the n number of values of probe pressure; and after the optimum value of probe pressure is determined, the probe pressure is maintained at the optimum value to proceed the probe test. However, in the third embodiment to be described below, a quite distinct technical concept from the described embodiments is employed, as indicated below.

a) The probe pressure is changed each time a test over a given number of IC chips has been completed. Rather than optimizing the probe pressure and maintaining it, the probe pressure is continually changed by a small increment.

b) A trial over a plurality of values of probe pressure is not employed.

c) After the test over a given number of IC chips with a single value of probe pressure has been completed, it is then determined whether the adoption of that single value of probe pressure is correct on the basis of a tendency of change exhibited in the determined fraction defective. Based on the result of this determination, a direction in which the probe pressure, which is to be applied to a subsequent given number of IC chips, is to be changed is determined.

Referring to the flowchart of FIG. 5, the present embodiment will now be described. Initially an initialization of the probe pressure is carried out (step S401), followed by conducting the test over a given number of IC chips (step S402), and calculating a fraction defective as a result of this test and storing it in the RAM 104 (step S403). It is then determined at a step S404 whether the test over the given number of IC chips which was carried out at the step S402 is an initial test. If the result of the determination is "YES", the probe pressure is changed by a predetermined amount in an appropriate direction (step S405), subsequently the process returning to the step S401. This is because when an initial test has just been completed, there are available only one value of determined fraction defective and one value of probe pressure, and accordingly a decision on the tendency of a change in the determined fraction defective and a change in the probe pressure (which is rendered at a step S406 and subsequent steps) cannot be rendered.

For a second and a subsequent test, the process proceeds from the step S404 to the step S406 wherein a comparison is made between a present value of fraction defective and a last value of fraction defective.

Assuming that the present value of fraction defective is reduced as compared with the last value of fraction defective, it follows that the probe pressure will gradually approach an optimum value if the present direction of change is maintained and the probe pressure is allowed to change in that direction. Accordingly, in this instance, it is determined whether the probe pressure was incremented or decremented at the last change of the probe pressure (step S407); and if the probe pressure was incremented at the last change, the probe pressure is also incremented (step S408). But if the probe pressure was decremented at the last change, the probe pressure is again decremented at the present change (step S409), thus changing the probe pressure by a predetermined amount in the direction thus determined.

By contrast, if the present value of fraction defective has risen with respect to the last value of fraction defective, it then follows that as a result of the last change of probe pressure, the probe pressure has passed through an optimum value. Meaning that if the probe pressure is allowed to be changed in the present direction, the probe pressure will shift further from the optimum value. Accordingly, in this instance, after the determination of a direction in which the last change of a probe pressure took place (step S410), the direction in which the probe pressure is to be changed is reversed. Therefore, if the last change was an increment, the present change should be a decrement (step S409), whereas if the last change was a decrement, the present change should be an increment (step S408), thus changing the probe pressure by a predetermined amount in the opposite direction.

Upon completion of changing the probe pressure, the process returns to the step S402, repeating the procedure described above.

Figure 6:
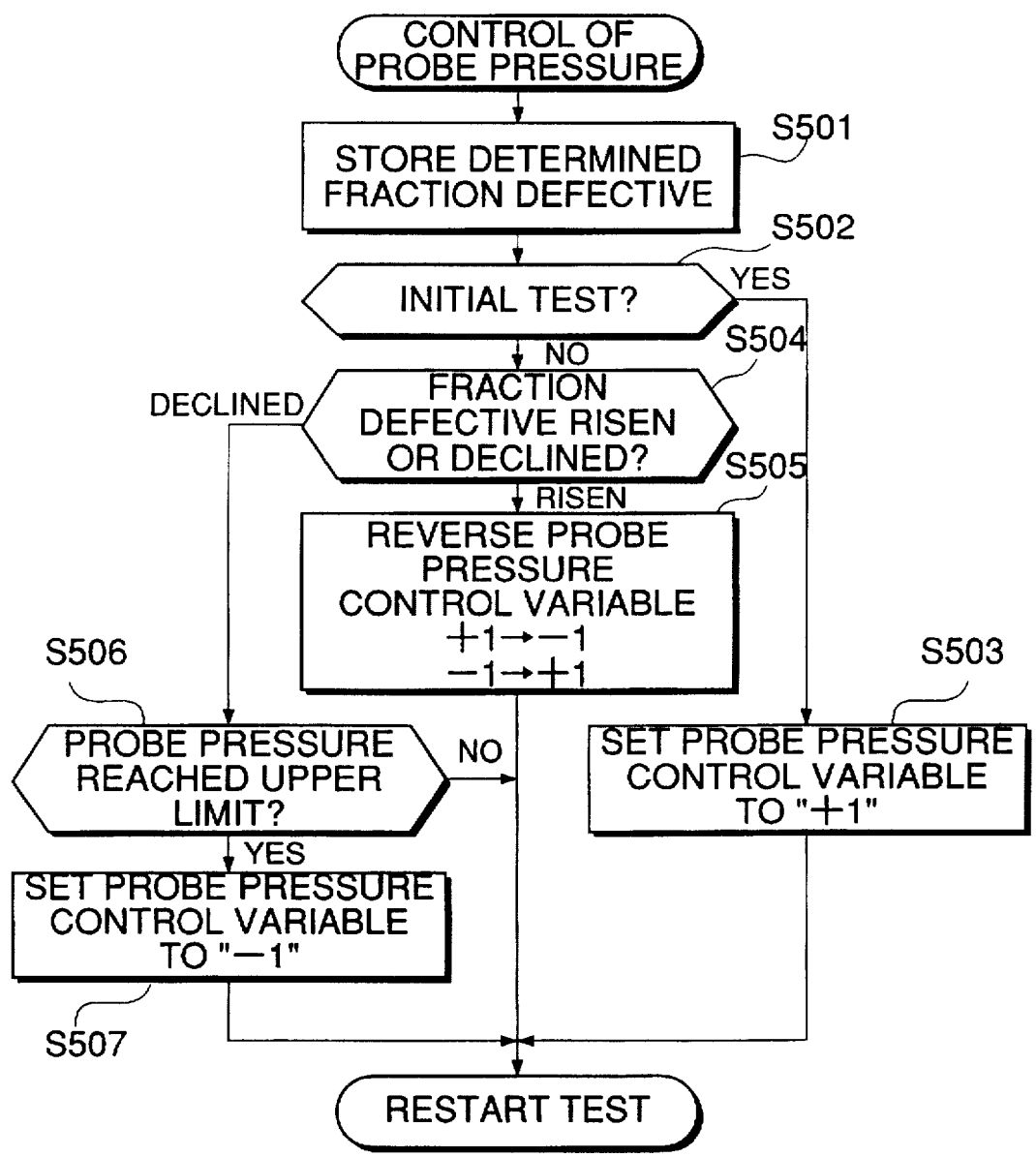
FIG. 6 is a flowchart of a testing method according to a fourth embodiment of the invention.

FIG. 6 is a flowchart of a testing method according to a fourth embodiment of the invention. In the present embodiment, each time the test over a given number of IC chips and calculation of a corresponding determined fraction defective are completed, a probe pressure control routine shown in FIG. 6 is started, setting up a probe pressure control variable representing an increment/decrement of the probe pressure. Initially, a determined fraction defective obtained as a result of the present test over a given number of IC chips is stored in the RAM 104 (step S501). It is then determined whether the present execution of the routine is an initial one (step S502). If it is the initial one, the probe pressure control variable is set to "+1", for example, for the wafer prober 200 (step S503). Thus, the desired elevation value when the wafer support base 205 is to be lifted is increased by one unit. The test of IC chips is then restarted.

In a second and a subsequent execution of the routine, the process proceeds from the step S502 to a step S504 wherein a comparison is made between the present value of fraction defective as a result of the present test and the last value of fraction defective stored in the RAM 104. If it is found that the determined fraction defective has risen, the probe pressure control variable which is to be selected for the wafer prober 200 is reversed in sign (step S505), followed by restarting the test. In this manner, a correction is made so that the probe pressure which has once passed through an optimum value is brought back closer to the optimum value.

On the other hand, if the determined fraction defective has declined, the probe pressure may be changed in the direction which is presently established. However, when the optimum value of probe pressure is a very large value, increasing the probe pressure toward the optimum value is likely to cause damage to the electrode pads. To cope with this likelihood, a determination is made as to whether the present probe pressure has already reached a predetermined upper limit (step S506). If the result of the determination is "YES", the probe pressure control variable is set to "−1" (step S507), while if the result of the determination is "NO", the probe pressure control variable is maintained at the present value.

Figure 7:
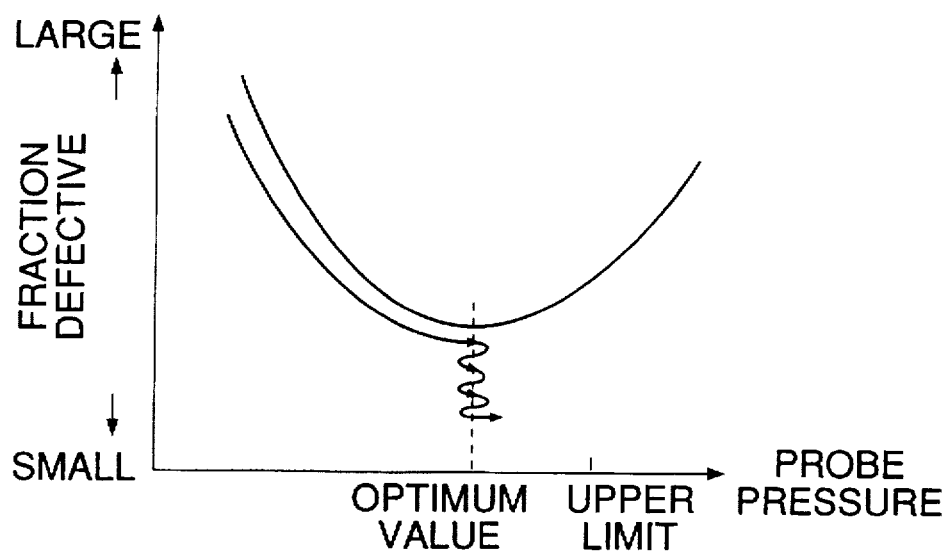
FIG. 7 is a graphical illustration of the operation of the embodiment shown in FIG. 6.
Figure 8:
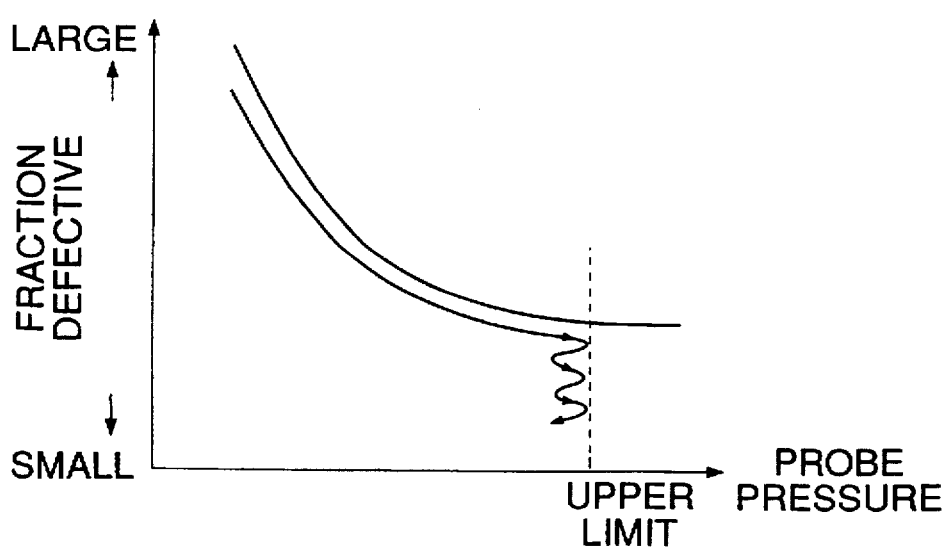
FIG. 8 is a similar graphical representation of the operation of the embodiment shown in FIG. 6.
Figure 9:
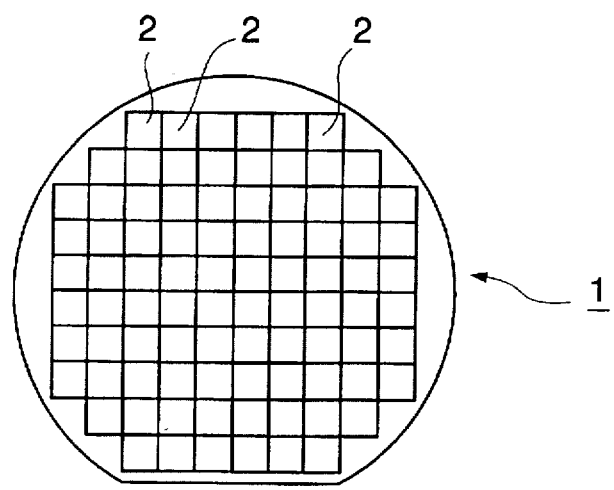
FIG. 9 is a plan view of a wafer.
Figure 10:
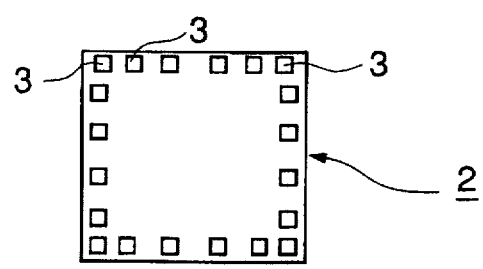
FIG. 10 is a plan view of an IC chip in the wafer.
Figure 11:
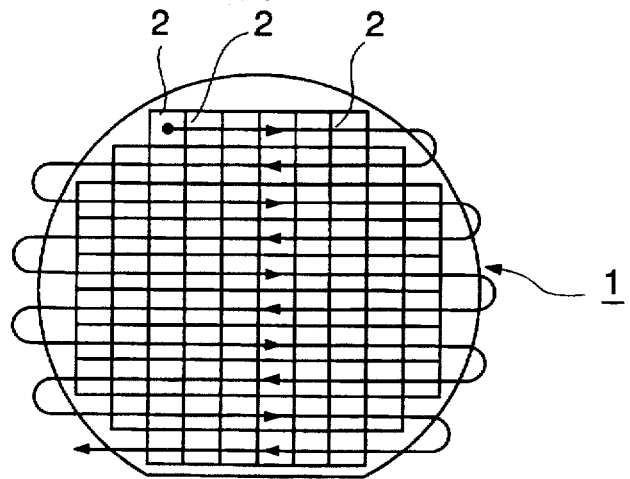
FIG. 11 is a schematic illustration useful in explaining a procedure for the probe test.

FIGS. 7 and 8 graphically illustrate several examples of operation of the present embodiment. In each figure, a curve with arrows indicates a manner in which the probe pressure changes when the control is performed according to the present embodiment. Since "+1" is chosen for the probe pressure control variable at the commencement of the probe test whenever the probe pressure control routine is executed, the determined fraction defective gradually decreases, and the probe pressure increases as long as the decreasing tendency of the fraction defective is maintained. When the optimum value of probe pressure lies at a point below the predetermined upper limit as indicated in FIG. 7, after the probe pressure has passed the optimum value, the step S505 is likely to be executed as the routine shown in FIG. 6 is executed, whereby the probe pressure is alternately incremented and decremented around the optimum value, thus repeating an oscillation with a small amplitude.

On the other hand, when the optimum value of the probe pressure lies at a point above the predetermined upper limit as shown in FIG. 8, the probe pressure reaches the upper limit before the optimum value is reached. Accordingly, there is a tendency that steps S505 and S507 are executed in alternate fashion as the routine shown in FIG. 6 is executed, whereby the probe pressure once reaches the predetermined upper limit and is then decremented, again reaches the upper limit and then decremented, repeating an oscillation with a small amplitude.

It will be seen that the probe pressure undergoes small amplitude oscillation, but is maintained at or close to the optimum value or the upper limit.

While several embodiments of the invention have been described above, it should be understood that the invention is not limited thereto, but other embodiments, not shown, are also contemplated as stated below.

(1) Information which is used to control the probe pressure is produced on the part of the LSI tester in the described embodiments, but such function may be served by the wafer prober. Thus in such configuration, the wafer prober holds the leadership in controlling the probe pressure while the LSI tester serves supplying information on a result of the test of IC chips or a determined fraction defective over a given number of IC chips in response to a request from the wafer prober. Based on such information supplied from the LSI tester, the wafer prober controls the elevation to which the wafer support base is to be lifted.

(2) In the first embodiment described above, an optimization of the probe pressure takes place only at commencement of the probe test. During the optimization of the probe pressure, no marking is applied to an IC chip or chips which are determined to be defective. During the optimization of the probe pressure, it is possible that a considerable number of IC chips may be inadvertently determined to be defective as a result of improper probe pressure and accordingly, by inhibiting applying a marking to such IC chips, a reduction in the yield can be prevented. IC chips which are tested during the optimization of the probe pressure are again subjected to the same test after the completion of the optimization, and a marking of defective product or products may then be carried out.

(3) Values of fraction defective at a plurality of different values of probe pressure may be obtained by testing the same IC chip, and an optimum value of probe pressure may be determined on the basis of the obtained values of fraction defective.

What is claimed is:

1. A method of testing semiconductor integrated circuits, in which probe styli are brought into contact with electrodes on integrated circuit chips formed in a semiconductor wafer to test circuit characteristics of said integrated circuit chips, the method comprising:

a) conducting a test of a set number of said integrated circuit chips;

b) calculating a fraction defective over said set number of said integrated circuit chips as a result of said test; and c) controlling probe pressure with which said probe styli contact said electrodes on said integrated circuit chips, based on the calculated fraction defective.

2. The method of claim 1, further comprising:

d) sequentially setting probe pressure with which said probe styli contact said electrodes on said integrated circuit chips, to a plurality of distinct values;

e) conducting a test of the set number of said integrated circuit chips at each of said plurality of distinct values of probe pressure;

f) calculating a fraction defective over said set number of said integrated circuit chips as a result of said test whenever said probe pressure is set to said each of said plurality of the distinct probe pressure values; and g) selecting a value of probe pressure which exhibited a minimum value of fraction defective as the calculated fraction defective, from among said plurality of distinct pressure values.

3. The method of claim 1, further comprising:

d) sequentially conducting a test of each of the set number of said integrated circuit chips including applying the probe styli to the electrodes of the integrated circuit chips at a test pressure value and calculating a fraction defective over said set number of said integrated circuit chips as a result of said test;

e) changing probe pressure with which said probe styli contact said electrodes on said integrated circuit chips, to a pressure value distinct from the test pressure value applied in said test conducted in said step d) whenever the calculated fraction defective exceeds a predetermined value;

f) conducting a test of said set number of said integrated circuit chips at said distinct value of probe pressure whenever said probe pressure is changed to the distinct value;

g) calculating said fraction defective over said set number of said integrated circuit chips as a result of said test conducted at said distinct value of probe pressure; and h) selecting a value of probe pressure which exhibited a minimum value of fraction defective as the fraction defective calculated at said step g), from among a plurality of values of probe pressure selected as the distinct value applied in said test conducted in said step f).

4. The method of claim 1, further comprising:

d) sequentially conducting a test of each of a given number of said integrated circuit chips and calculating a fraction defective over said given number of said integrated circuit chips as a result of said test;

e) changing probe pressure with which said probe styli contact said electrodes on said integrated circuit chips, on a basis of at least one change in the fraction defective calculated at said step d) previously conducted at least one time, in a manner such that:

i) if the probe pressure is increased from a previous test at step d) to a current test at step d), the probe pressure is increased at a future step d) when the fraction defective decreases from the previous test at step d) to the current test at step d) and the probe pressure is decreased at a future step d) when the fraction defective increases from the previous test at step d) to the current test at step d); and ii) if the probe pressure is decreased from the previous test at step d) to the current test at step d), the probe pressure is increased at the future step d) when the fraction defective increases from the previous test at step d) to the current test at step d) and the probe pressure is decreased at the future step d) when the fraction defective decreases from the previous test at step a) to the current test at step d); and f) alternatively repeating said steps d) and e).

5. The method of claim 4, further comprising the steps of:

determining whether the probe pressure has reached a predetermined upper limit; and reducing the probe pressure if the probe pressure has reached the predetermined upper limit.

* * * * *